(12) United States Patent
Bright (10) Patent No.: US 6,980,437 B2
(45) Date of Patent: Dec. 27, 2005

(54) PLUGGABLE ELECTRONIC RECEPTACLE WITH HEAT SINK ASSEMBLY

(75) Inventor: Edward John Bright, Middletown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 6 days.

(21) Appl. No.: 10/792,046

(22) Filed: Mar. 3, 2004

(65) Prior Publication Data

US 2005/0195565 A1 Sep. 8, 2005

(51) Int. Cl.[7] ............................................. H05K 7/20
(52) U.S. Cl. ...................... 361/704; 361/715; 361/716; 361/719; 165/80.3; 165/185
(58) Field of Search ................. 361/683–690, 361/704, 714–721, 727–729; 165/80.2, 80.3, 165/185; 257/718–719, 727; 439/631

(56) References Cited

U.S. PATENT DOCUMENTS

| | | | |
|---|---|---|---|
| 5,946,192 A * | 8/1999 | Ishigami et al. ............ | 361/704 |
| 6,392,884 B1 * | 5/2002 | Chou .......................... | 361/687 |
| 6,434,000 B1 * | 8/2002 | Pandolfi ...................... | 361/685 |
| 6,749,448 B2 * | 6/2004 | Bright et al. ................ | 439/160 |
| 6,752,663 B2 * | 6/2004 | Bright et al. ................ | 439/607 |
| 6,816,376 B2 * | 11/2004 | Bright et al. ................ | 361/704 |
| 6,817,886 B2 * | 11/2004 | Amorim ...................... | 439/377 |
| 6,870,746 B2 * | 3/2005 | Leeson et al. .............. | 361/816 |
| 6,875,056 B1 * | 4/2005 | Bianchini et al. ........... | 439/608 |
| 2005/0094378 A1 * | 5/2005 | Moulton et al. ............ | 361/704 |

\* cited by examiner

Primary Examiner—Boris Chérvinsky (57) ABSTRACT

A receptacle assembly includes a plurality of guide frames, each of the guide frames having top, bottom and side walls joined to form an interior cavity configured to receive an electrical module. Each of the plurality of guide frames have a heat sink opening extending through one of the top, bottom and side walls. A heat sink is mounted over each of the guide frames and extends through a respective one of the heat sink openings. Each respective heat sink has an engagement surface located proximate the interior cavity of each respective guide frame. The engagement surface of each heat sink is configured to physically contact a respective module when installed in each respective interior cavity. A heat sink clip spans the plurality of guide frames.

20 Claims, 6 Drawing Sheets

PLUGGABLE ELECTRONIC RECEPTACLE WITH HEAT SINK ASSEMBLY

CROSS REFERENCE TO RELATED APPLICATIONS

This application is related to U.S. application Ser. No. 10/382,208 filed Mar. 5, 2003, titled "Pluggable Electronic Module and Receptacle with Heat Sink", now issued U.S. Pat. No. 6,816,376, the complete disclosure of which is hereby incorporated by reference in its entirety.

BACKGROUND OF THE INVENTION

The invention relates generally to an electronic transceiver assembly, and more particularly, to a heat sink assembly for transceivers pluggable into a receptacle module.

Various types of fiber optic and copper based transceivers that permit communication between electronic host equipment and external devices are known. These transceivers may be incorporated into modules that can be pluggably connected to the host equipment to provide flexibility in system configuration. The modules are constructed according to various standards for size and compatibility, one standard being the Small Form-factor Pluggable (SFP) module standard.

The SFP module is plugged into a receptacle that is mounted on a circuit board within the host equipment. The receptacle includes an elongated guide frame, or cage, having a front that is open to an interior space, and an electrical connector disposed at a rear of the cage within the interior space. Both the connector and the guide frame are electrically and mechanically connected to the circuit board, and when an SFP module is plugged into a receptacle it is electrically and mechanically connected to the circuit board as well. Conventional SFP modules and receptacles perform satisfactorily carrying data signals at rates up to 2.5 gigabits per second (Gbs).

A standard currently in development for a next generation of SFP modules, presently being called the XFP standard, calls for the transceiver modules to carry data signals at rates up to 10 Gbs. Transceiver modules conforming to the XFP Standard and the surrounding circuitry will generate significantly greater quantities of heat to be removed in order for the electronic components to survive long term in comparison to previous module standards.

U.S. application Ser. No. 10/382,208, filed Mar. 5, 2003, titled "Pluggable Electronic Module and Receptacle with Heat Sink", is directed toward a receptacle assembly that includes a guide frame having top, bottom and side walls joined to form an interior cavity configured to receive an electrical module. One of the top, bottom and side walls has an opening therethrough, and a heat sink is mounted over the opening. The heat sink has an engagement surface located proximate the interior cavity of the guide frame, and the engagement surface of the heat sink is configured to physically contact the electric module when installed in the interior cavity. The heat sink dissipates heat generated in the module and facilitates a data transmission rate of 10 Gbs through the assembly.

BRIEF DESCRIPTION OF THE INVENTION

According to an exemplary embodiment of the present invention, a receptacle assembly comprises a plurality of guide frames. Each of the guide frames have top, bottom and side walls joined to form an interior cavity configured to receive an electrical module, and each of the plurality of guide frames have a heat sink opening extending through one of the top, bottom and side walls. A heat sink is mounted over each of the guide frames and extends through a respective one of the heat sink openings, and each respective heat sink has an engagement surface located proximate the interior cavity of the respective guide frame. The engagement surface of each heat sink is configured to physically contact a respective module when installed in the respective interior cavity, and a heat sink clip spans the plurality of guide frames.

Optionally, the heat sink clip comprises retention beams extending over the plurality of guide frames, and the assembly further comprises interposer spring elements actuated by the retention beams. The spring element contact a respective heat sink and exert a clamping force thereupon. The clip comprises side rails that snap over the side walls of the plurality of guide frames, and the side rails are joined by retention beams to extend over, and flexibly engage, the heat sinks of each respective guide frame.

According to another exemplary embodiment, a transceiver receptacle assembly comprises a plurality of guide frames aligned with one another and having top, bottom and side walls joined to form an interior cavity configured to receive a transceiver. The top wall of each guide frame has a heat sink opening therethrough, and a heat sink is mounted over each respective guide frame. Each heat sink has an engagement surface located proximate the interior cavity of each respective guide frame, and the engagement surface of the heat sink is configured to physically contact the transceiver when installed in the interior cavity. A plurality of interposer spring elements are provided, and each of the interposer spring elements exert a normal force on a respective one of the plurality of heat sinks.

According to still another exemplary embodiment, an electronic transceiver assembly is provided. The assembly comprises a plurality of guide frames, each having top, bottom and side walls joined to form an interior cavity and having a heat sink opening extending through one of the top, bottom and side walls. A plurality of transceivers are each configured to be received in a respective one of the guide frames. A plurality of heat sinks are provided, and each respective heat sink is mounted over a respective one of the guide frames and extends through a respective one of the heat sink openings. Each respective heat sink has an engagement surface located proximate the interior cavity of the respective guide frame, and the engagement surface of each heat sink is configured to physically contact a respective one of the transceivers when installed in the respective interior cavity. A heat sink clip spans the plurality of guide frames.

DETAILED DESCRIPTION OF THE INVENTION

Figure 1:
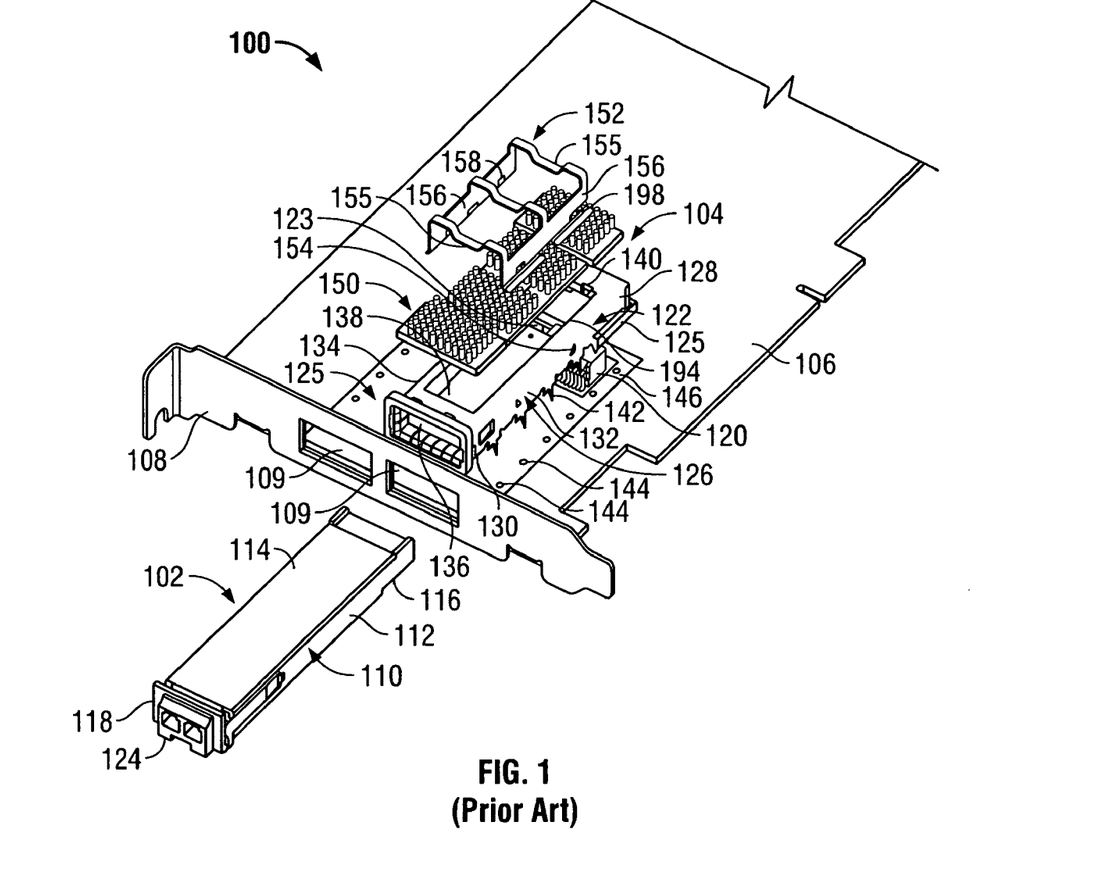
FIG. 1 is an exploded perspective view of a known module assembly and a receptacle assembly.

FIG. 1 illustrates a known electronic transceiver assembly 100 including a module assembly 102 configured for pluggable insertion into a receptacle assembly 104 which is shown to better understand the subject matter of the present invention which is described below. The module assembly 102 is capable of transmitting data at rates of, for example, 10 Gbs and conforms to the XFP Standard. It is understood, however, that the invention may be employed with other types of electronic modules conforming to other standards and specifications. The description set forth below is therefore provided solely for purposes of illustrating the invention, and is not intended to limit the application of the invention to any particular module or connector.

As illustrated in FIG. 1, the receptacle assembly 104 is mounted to a host circuit board 106, which, in turn, is mounted in a host system such as a router or server (not shown). The host system typically includes a conductive chassis having a bezel 108 including openings 109 therethrough in substantial alignment with a respective receptacle assembly 104. The module assembly 102 is inserted into the receptacle assembly 104 through the bezel opening 109, and the receptacle assembly 104 is electrically connected to the bezel 108.

In an illustrative embodiment, the module assembly 102 includes a housing 110 including a base 112 and a cover 114 that are secured together to form a protective shell for a circuit board (not shown in FIG. 1) that is disposed within the housing 110. The circuit board carries electronic circuitry and devices that perform transceiver functions in a known manner. An edge of the circuit board is exposed through a rear 116 of the housing 110, and the circuit board edge is pluggable into the receptacle assembly 104 as described below. The module assembly 102 is adapted for installation into the receptacle assembly 104 such that a front end 118 of the module assembly 102 is extended therefrom.

The module assembly 102 is configured to be inserted into the receptacle assembly 104. In general, the module assembly 102 and receptacle assembly 104 may be used in any application requiring an interface between a host system and electrical or optical signals. The module assembly 102 interfaces to the host system through the receptacle assembly 104 via a receptacle connector 120 which is located within a receptacle guide frame 122, also referred to as a cage. The module assembly 102 interfaces to an optical fiber or electrical cable (not shown) through a connector interface 124 at a front end 118 of the module assembly 102. Preferably, the connector interface 124 comprises a mechanism that cooperates with a fiber or cable assembly to secure the fiber or cable assembly to the module assembly 102. Suitable connector interfaces 124 are known and include adapters for the LC style optical connectors and the HSSDC2 copper connectors offered by Tyco Electronics Corporation (Harrisburg, Pa.).

The module assembly 102 and the receptacle assembly 104 reduce EMI emission through one or more of several EMI reduction features, including guide frame 122, a gasket assembly 125 coupled to a forward end of the guide frame 122 that interfaces with bezel 108, and intermediate and rear gasket assemblies 123, 125. The EMI reduction features are described in detail in U.S. application Ser. No. 10/382,208 filed Mar. 5, 2003, which is hereby incorporated by reference.

As illustrated in FIG. 1, the guide frame 122 includes a stamped and formed metal body 126 that defines a shell having a top wall 128, a bottom wall 130, and side walls 132, 134. Front edges of each of the top, bottom and side walls 128–134 are formed as flanges which surround a front opening 136 into the guide frame 122. The top wall 128, the bottom wall 130, and the side walls 132, 134 define a cavity 138 therebetween for receiving the module assembly 102 through an opening 136 in the front end of the guide frame 122. The bottom wall 130 has a bottom opening to receive the receptacle connector 120. The guide frame 122 has a positive stop 140, which engages a surface of the module assembly 102 to prevent the module assembly 102 from passing too far rearwardly through the guide frame 122. When the module assembly 102 is inserted into the receptacle assembly 104, the guide frame 122 provides conductive walls on all sides thereof. The bottom wall 130 of guide frame 122 includes compliant pin leads 142 that are received within through-holes 144 of the host board 106 and provide a conductive path to ground of an equipment chassis when the receptacle assembly 104 is mounted therein. The host board 106 includes a conductive surface 146 provided thereon and formed as a sheet to underlie receptacle assembly 104 to enhance the electromagnetic interference shielding.

The receptacle connector 120 is mounted on the circuit board 106 of the host equipment along with the guide frame 122, but separated from the conductive surface 146 of the host board 106. The receptacle connector 120 may be, for example, that which is sold under part number 788862-1 by Tyco Electronics Corporation. The receptacle connector 120 includes a slot that receives an edge of the circuit board that is carried by the module assembly 102 when the module assembly 102 is fully installed in the guide frame 122, thereby electrically connecting the module assembly 102 to the host equipment.

The top wall 128 of the guide frame 122 has a large opening 194 overlying the cavity 138 that accommodates a heat sink 150. The heat sink 150 is positioned to make physical contact with the module assembly 102 when the module assembly 102 is installed into the receptacle assembly 104. A clip 152 is mounted over the heat sink 150 and is secured to the guide frame 122. The clip 152 ensures that the heat sink 150 is loaded against the module assembly 102 to facilitate thermal transfer from the module assembly 102 to the heat sink 150. The heat sink 150 includes an engagement surface (described below) that faces and is located proximate the interior cavity 138 of the guide frame 122. The engagement surface of the heat sink 150 is configured to physically contact and abut against the module assembly 102 when installed in the cavity 138.

A retention tab 154 is formed on each of the side walls 132, 134 of the guide frame 122. The retention tabs 154 engage the clip 152 which, in turn, retains the heat sink 150 on the guide frame 122. The clip 152 securely engages the guide frame 122 to retain the heat sink 150 upon the guide frame 122. The clip 152 includes resilient spring members 155 secured over the heat sink 150. The spring members 155 flex to permit the heat sink 150 to move outward away from the guide frame 122 when the module assembly 102 is installed. The spring members 155 exert a desired force against the heat sink 150 to maintain a desired abutting interface to facilitate thermal transfer and heat dissipation from the module assembly 102. The clip 152 further includes side rails 156 that snap over the side walls 132, 134 of the guide frame 122. The side rails 156 are joined to one another by spring members 155 that extend over, and flexibly engage, the heat sink 150.

Figure 2:
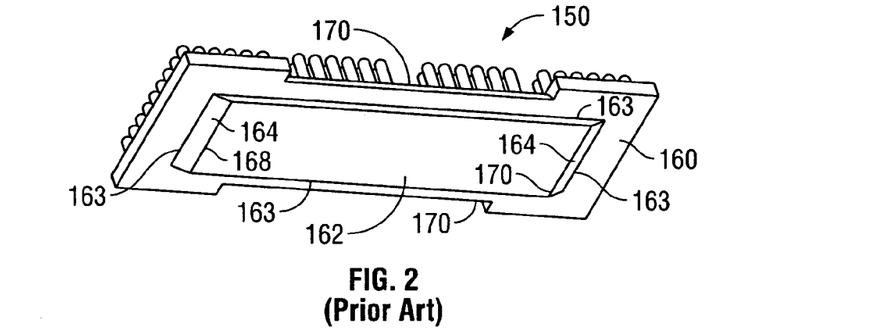
FIG. 2 is a bottom perspective view of the heat sink shown in FIG. 1.

FIG. 2 illustrates a bottom perspective view of the heat sink 150 including a peripheral outer surface 160 and module engagement surface 162 that is stepped relative to the peripheral surface 160 to extend into the interior cavity 138 of the guide frame 122. The peripheral surface 160 surrounds the engagement surface 162 on the periphery or perimeter 163 thereof, and the peripheral surface 160 is recessed relative to a plane extending through the engagement surface 162. In one embodiment, the engagement surface 162 is approximately centered within the peripheral surface 160, and a ramped transition portion 164 extends on each of the leading edges 168 of the engagement surface 162. Notched or cut out portions 170 are formed in the longitudinal side walls of the heat sink 150 to accommodate the clip 152 (shown in FIG. 1) when the heat sink 150 is installed.

The engagement surface 162 of the heat sink 150 rests within the interior cavity 138 of the guide frame 122 at a level that interferes with an installation path of the module assembly 102. The heat sink 150 is moved outward by the module assembly 102, as further described below, when the module assembly 102 is installed to provide an abutting interface between the heat sink 150 and the module assembly 102.

Returning to FIG. 1, when the module assembly 102 is removed, the engagement surface 162 of the heat sink 150 rests within the interior cavity 138 of the guide frame 122 at a level that interferes with an installation path of the module assembly 102. The heat sink 150 is movable outward by the module assembly 102 when the module assembly 102 is installed to provide an abutting interface between the heat sink 150 and the module assembly 102. The engagement surface 162 of the heat sink 150 is flat and smooth to slide along a mating surface of the module assembly 102 when the module assembly 102 is installed.

Figure 3:
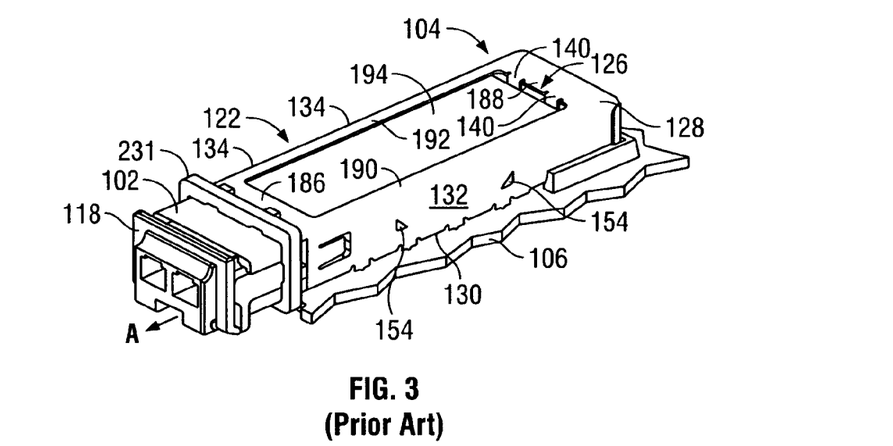
FIG. 3 is an assembled perspective view of a portion of the assembly shown in FIG. 1, showing the module assembly in a latched position within the receptacle assembly.

FIG. 3 is a perspective view of the receptacle assembly 104 mounted to the host board 106 and receiving the module assembly 102, with the heat sink 150 and the clip 152 removed for clarity. Also, the bezel 108 is not shown in FIG. 3.

The module assembly 102 is illustrated in a latched position wherein removal from the guide frame 122 is prevented. An axial pull on the front end 118 of the module assembly 102 in the direction of arrow A, when latched, is ineffective to remove the module assembly 102. In the latched position, the front end 118 of the module assembly 102 extends or protrudes outwardly a specified distance from an EMI gasket collar 231 which is positioned in abutting contact with an interior surface (not shown in FIG. 3) of the bezel 108 (shown in FIG. 1) in use. The bezel 108 includes a gasket (not shown) that is permanently fastened thereto, and the collar 231 is positioned in contact with the gaskets for EMI shielding The gasket and the collar 231 are more completely described in U.S. application Ser. No. 10/382,208.

The guide frame 122 includes a conductive body 126 that is formed from a metallic sheet plated with tin/lead in an exemplary embodiment. The body 126 is formed into a shell having a top wall 128, a bottom wall 130, and side walls 132, 134. The top wall 128, the bottom wall 130, and the side walls 132, 134 define the cavity 138 (shown in FIG. 1) in which the module assembly 102 is received.

The top wall 128 of the guide frame 122 includes a front portion 186, a rear portion 188, and opposed lateral portions 190, 192 that define a perimeter of the opening 194. The portions 186–192 of the top wall 128 also define a maximum distance that the heat sink 150 (shown in FIGS. 1 and 2) extends into the cavity 138 (shown in FIG. 1) in which the module assembly 102 is contained. The top wall 128 supports the heat sink 150 when the heat sink 150 is mounted over the opening 194. The retention tabs 154 are punched from each of the respective side walls 132, 134 and bent outwardly. The retention tabs 154 engage mating openings 198 in the side rails 156 (shown in FIG. 4) in the clip 152 (also shown in FIG. 1) when the heat sink 150 is attached to the guide frame 122. The retention tabs 154 are triangular in shape, which restricts the clip 152 from movement in both a vertical and horizontal direction relative to the guide frame 122, although it is recognized that other shapes for the retention tabs 154 may be employed.

The rear portion 188 of the top wall 128 includes positive stops 140 in the form of downwardly extending tabs that project slightly inward into the opening 194 and downward into the cavity 138. The stops 140 engage a rear surface of the module assembly 102 to prevent the module assembly 102 from passing rearwardly through the guide frame 122 beyond a specified distance.

Figure 4:
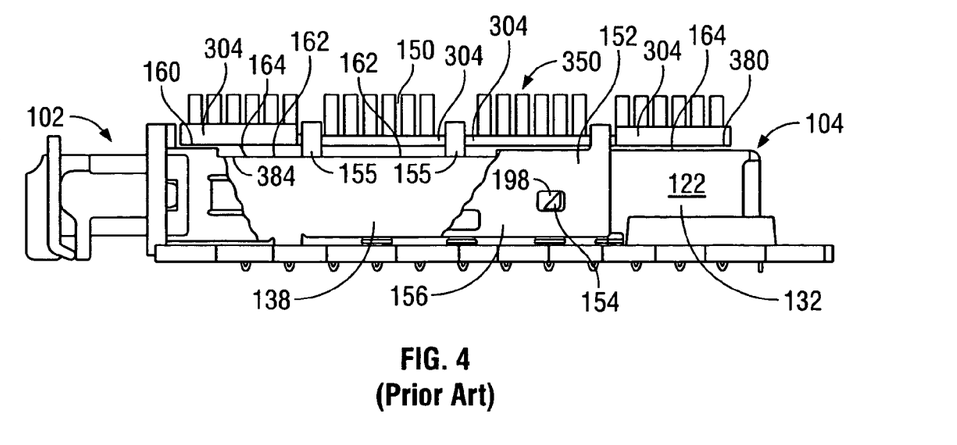
FIG. 4 is a side elevational view, partly broken away, of the beat sink assembly shown in FIG. 1 attached to the receptacle assembly.

FIG. 4 illustrates a heat sink assembly 350 coupled to the guide frame 122 and with the module assembly 102 inserted therein. The heat sink 150 is installed over the cavity 138 in the guide frame 122 and the tabs 154 in the side walls 132, 134 of the guide frame 122 are received in the apertures 198 in the side rails 156 of the clip 152. The clip 152 positions a lower engagement surface 162 of the heat sink 150 in the path of the module assembly 102. As shown in the broken away portion of FIG. 4 (and also shown in FIG. 2), in an exemplary embodiment the base 304 includes a lower peripheral surface 160 surrounding the engagement surface 162. The peripheral surface 160 is recessed with respect to a plane containing the engagement surface 162, or in other words, the engagement surface 162 extends outwardly from the peripheral surface 160 toward a top surface 384 of the module assembly 102. The opposed lateral portions 186, 188, 190, 192 (shown in FIG. 3) of the top wall 128 of the guide frame 122 support the peripheral surface 160 of the heat sink 150 when the module assembly 102 is not installed.

As the module assembly 102 is inserted into the cavity 138 of the guide frame 122, the top surface 384 of the module assembly 102 upwardly displaces the engagement surface 162 of the heat sink 150 against the bias of clip 152. Consequently, the clip 152 provides a downward bias or pressure via spring members 155 to maintain the two surfaces 162, 384 in contact for optimal heat transfer therebetween. Ramped transition portion 164 extends between the heat sink engagement surface 162 and the peripheral surface 160 to facilitate smooth engagement of the heat sink engagement surface 162 and the top surface 384 of the module assembly 102 during installation and removal from the receptacle assembly 104. Additionally, the engagement surface 162 is flat and smooth to facilitate sliding insertion of the module assembly 102. While heat transfer between the heat sink 150 and the module assembly 102 is provided through metal-to-metal contact of the module top surface 384 and the heat sink engagement surface 162, it is understood that a thermal interface material could be incorporated in further and/or alternative embodiments to enhance or alter the heat transfer relationship.

Figure 5:
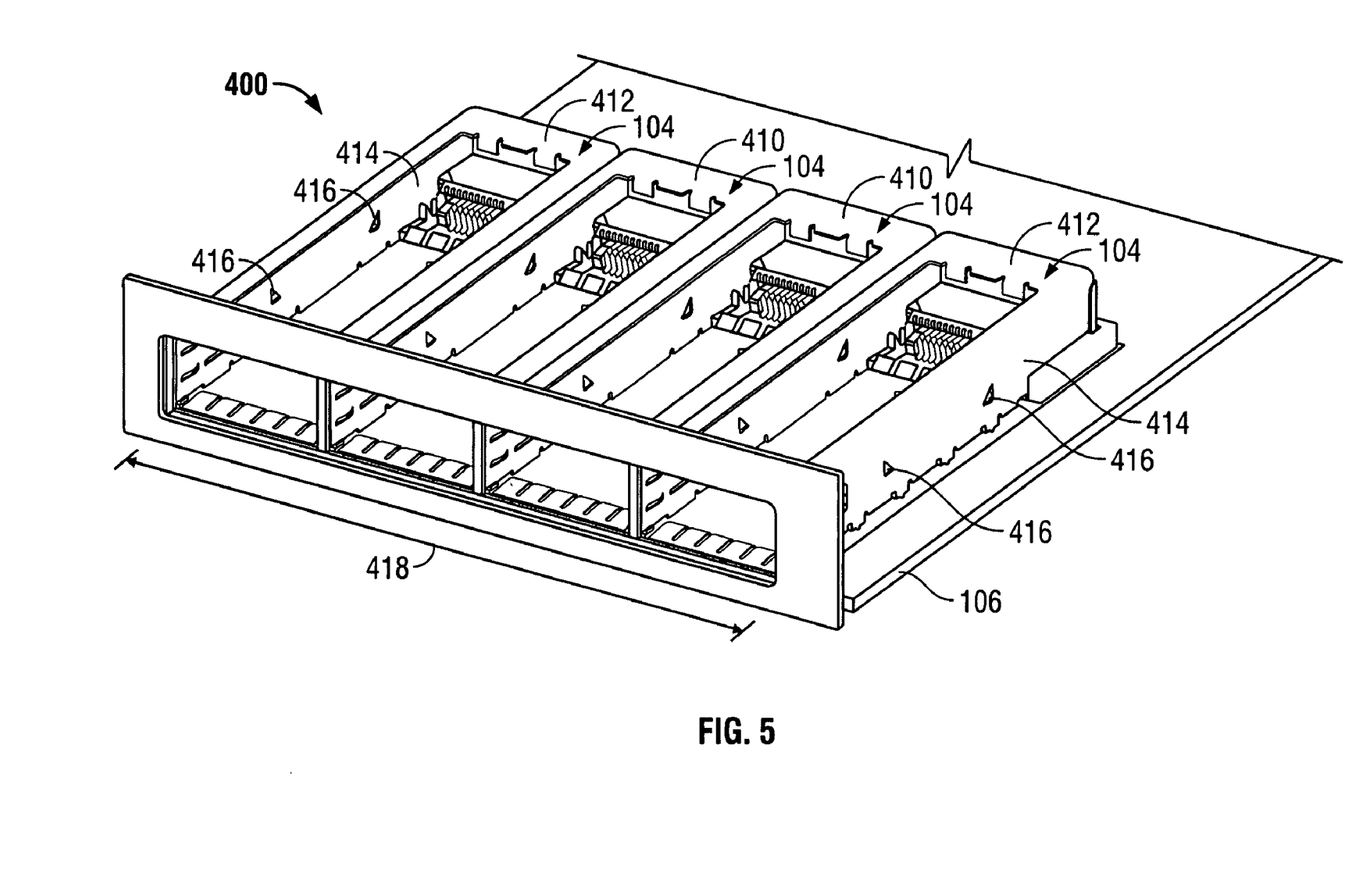
FIG. 5 is a perspective view of a portion of an exemplary embodiment of the receptacle assembly formed in accordance with the invention.

FIG. 5 illustrates a portion of an exemplary embodiment of a receptacle assembly 400 formed in accordance with an exemplary embodiment of the invention. The receptacle assembly 400 includes a plurality of receptacle assembly units, which may be, for example, receptacle assembly 104 (shown in FIGS. 1, and 3–4). The receptacle assemblies 104 are configured for mating with a plurality of transceivers, such as, for example, the module assembly 102 (shown in FIGS. 1, and 3–4). In general, the module assemblies 102 and receptacle assemblies 104 may be used in any application requiring an interface between a host system and electrical or optical signals. Receptacle assembly 400 is adapted to address, among other things, heat dissipation and electromagnetic shielding for components conveying data signals at high rates, such as data transmission rates of 10 Gbs. It is appreciated, however, that the benefits and advantages of the invention may accrue equally to other data transmission rates and across a variety of systems and standards.

In an illustrative embodiment, and as shown in FIG. 5, the receptacle assembly 400 includes four receptacle assemblies 104 fastened to a host board 106, thereby securing the receptacle assemblies 104 in position relative to one another. It is appreciated, however, that the benefits and advantages of the invention may occur with a greater or lesser number of receptacle assemblies 104, and with the use of a variety of receptacle assemblies 104, including but not limited to the XFP standard and SFP module standards.

In an illustrative embodiment, the receptacle assembly 400 includes inner receptacle assemblies 410 and outer receptacle assemblies 412. Each outer receptacle assembly 412 includes an exterior side wall 414 that engages the heat sink clip side rails, as described below. Each exterior side wall 414 include includes retention tabs 416, such as, for example, retention tabs 154 described above. Each receptacle assembly 104 is substantially aligned and positioned on the circuit board 106 in close proximity with the adjacent receptacle assembly 104 so as to minimize the total space used on the circuit board 106, and as such the receptacle assemblies 104 have a length 418 which spans from one exterior side wall 414 of an outer receptacle assembly 412 to the other exterior side wall 414 of the opposed outer receptacle assembly 412.

Figure 6:
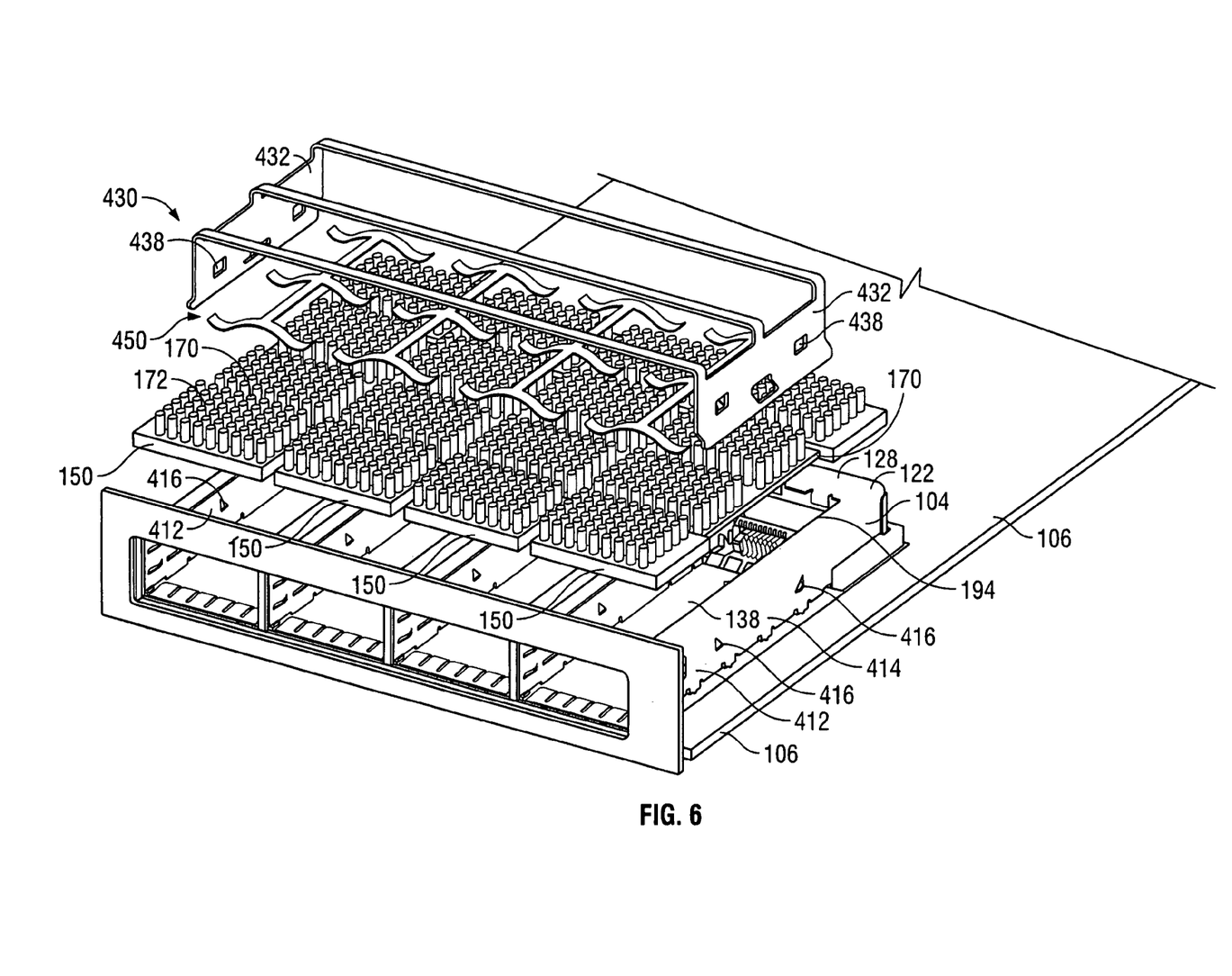
FIG. 6 is an exploded perspective view of an exemplary embodiment of the receptacle assembly, showing exemplary heat sink assemblies attached to the portion of the receptacle assembly shown in FIG. 5.

FIG. 6 is an exploded perspective view of the receptacle assembly 400 including heat sinks 150 positioned adjacent the respective receptacle assemblies 104, corresponding interposer spring elements, or members 450, and a heat sink clip 430 thereon. The top wall 128 of the guide frames 122 of each of the receptacle assemblies 104 have a large opening 194 overlying a cavity 138 which accommodates a heat sink, such as, for example, heat sink 150 (shown in FIG. 2). Each of the heat sinks 150 is positioned to make physical contact with corresponding module assemblies 102 (not shown) when the module assemblies 102 are installed into the receptacle assemblies 104. A heat sink clip 430 extends over and interacts with all of the heat sinks 150 and spans the length of the guide frames and is secured to the outer receptacle assemblies 412 via the retention tabs 416 on the exterior side walls 414 of each outer receptacle assembly 412. By using a single clip 430 with a plurality of receptacle assemblies and heat sinks 150, the receptacle assemblies may be spaced closer to one another than if each receptacle assembly employed its own heat sink clip. An amount of space occupied on the host board 106 by the assembly 400 is therefore reduced.

The receptacle assembly 400 also includes interposer spring members 450 that engage the heat sinks 150 and are actuated by the heat sink clip 430, as described below. The heat sink clip 430 and the interposer spring members 450 ensure that each of the heat sinks 150 are loaded against the module assemblies 102 (not shown) by providing a downward normal force on the heat sinks 150 to facilitate thermal transfer from each module assembly 102 to the respective heat sinks 150. Each of the heat sinks 150 includes an engagement surface that faces and is located proximate the interior cavities 138 of each of the guide frames 122. The engagement surfaces of the heat sinks 150 are configured to physically contact and abut against the module assemblies 102 when installed in the interior cavities 138.

Figure 7:
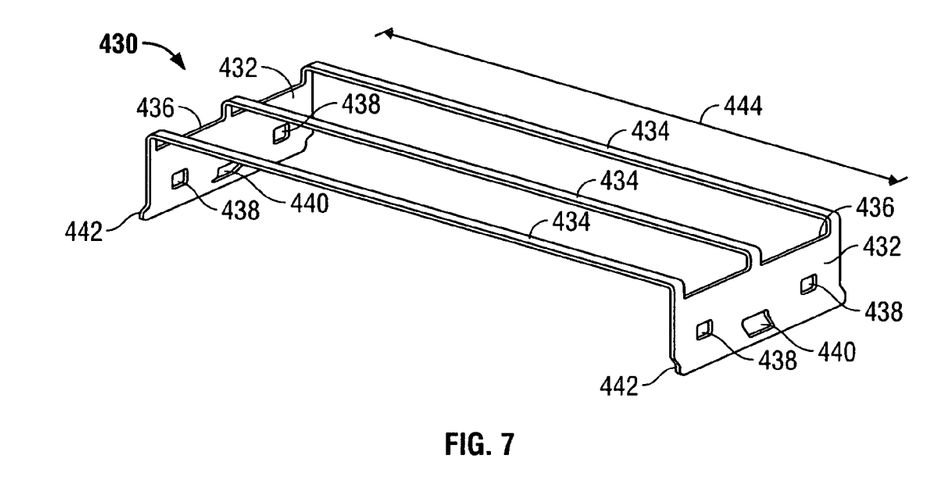
FIG. 7 is a perspective view of a heat sink clip.

FIG. 7 is a perspective view of an exemplary embodiment of the heat sink clip 430 which couples the heat sinks 150 to the guide frames 122 via the interposer spring members 450 as shown in FIG. 6. The heat sink clip 430 includes opposite side rails 432 connected by retention beams 434 extending from the upper edges 436, and the side rails 432 each include engagement openings 438 for interfacing engagement with the retention tabs 416 (shown in FIGS. 5 and 6) in the exterior side walls 414 of each outer receptacle assembly 412. The retention beams 434 have a length 444 which corresponds to the length 418 of the plurality of receptacle assemblies 104, as shown in FIG. 5, such that the side rails 432 frictionally engage the exterior side walls 414 of the outer receptacle assemblies 412. Each side rail 432 further includes a release aperture 440 that facilitates insertion of a tool, such as a screwdriver, to remove the heat sink clip 430 from the exterior side walls 414 of each outer receptacle assembly 412. A screwdriver or other tool may be inserted in the release aperture 440 to permit prying of the side rails 432 away from the guide frames 122, thereby releasing the rails 432 from beneath the retention tabs 416 and permitting removal of the heat sink clip 430 from the guide frames 122. The side rails 432 further include outwardly flared lower edges 442 to facilitate insertion of the heat sink clip 430 over the heat sinks 150 and the exterior side walls 414 of each outer receptacle assembly 412.

Figure 8:
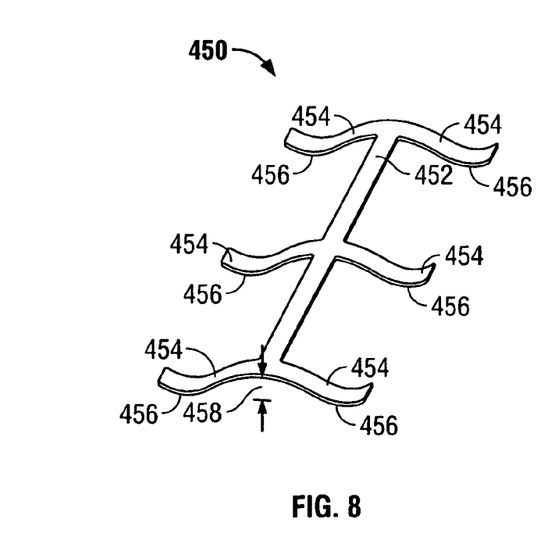
FIG. 8 is a perspective view of a spring element for use with the heat sink clip shown in FIG. 7.

FIG. 8 is a perspective view of an exemplary embodiment of the interposer spring member 450 shown in FIG. 6. The interposer spring member 450 is shaped to engage both a corresponding heat sink 150 and the heat sink clip 430 and is configured to exert a desired clamping force against the heat sinks 150 to maintain a desired abutting interface, as described below. Each interposer spring member 450 has a central body 452 which is linear and a plurality of arms 454 which have a curvilinear shape and which extend perpendicular from the central body 452. When installed, the interposer spring member arms 454 are substantially aligned with and located beneath the retention beams 434 of the heat sink clip 430. Each of the interposer spring member arms 454 have a contact point 456 which is the point of contact between the interposer spring members 450 and the respective heat sinks 150. The contact points 456 of the interposer spring member 450 are located a vertical distance 458 from the central body 452 and are the furthest vertical point of the interposer spring member arms 454 from the central body 452. The heat sink clip 430 actuates the interposer spring members 450 when installed, causing the interposer spring members 450 to flex, which decreases the vertical distance 458 between the contact points 456 and the central body 452. The interposer spring members 450 exert a desired clamping force against the heat sinks 150 to maintain a desired abutting interface to facilitate thermal transfer and heat dissipation from the module assemblies 102, however, the interposer spring members 450 flex to permit the heat sinks 150 to move outward away from the guide frames 122 when the module assemblies 102 are installed.

Returning to FIG. 6, the receptacle assemblies 104 are fastened to the host circuit board 106 by means of compliant pin terminals, and the heat sinks 150 are placed above the openings 194 in the guide frames 122. The interposer spring members 450 are inserted above the heat sinks 150 and the heat sink clip 430 is placed over the interposer spring members 450. The heat sink clip 430 interacts with each of the interposer spring members 450 to secure each of the heat sinks 150 with a desired clamping force. The side rails 432 are positioned to fit in the notched or cut out portions 170 of the outer most heat sinks 150. The retention tabs 416 on the exterior side walls 414 of each outer receptacle assembly 412 engage the engagement openings 438 on the heat sink clip 430 to retain the heat sink clip 430, which ultimately retains the heat sinks 150 on the guide frames 122. The heat sink clip 430 secures the guide frames 122 to each other after the heat sink clip 430 is installed. The heat sink clip 430 further includes side rails 432 that snap over the exterior side walls 414 of the outer receptacle assemblies 412. The side rails 432 are joined to one another by retention beams 434 that extend the length 444, which corresponds to the length 418 of the receptacle assemblies 104. In an illustrative embodiment, the heat sink clip 430 has three retention beams 434 extending from the upper edges 436 of the side rails 432.

In an exemplary embodiment, the retention beams 434 of the heat sink clip 430 engage each of the interposer spring members 450 to retain the corresponding heat sinks 150 upon the corresponding guide frames 122. As described above, the interposer spring members 450 include the central body 452 and a plurality of interposer spring member arms 454. The central body 452 of the interposer spring members 450 extends substantially perpendicular to the retention beams 434 of the heat sink clip 430 and have a length which is less than the length of the heat sinks 150. The interposer spring member arms 454 extend from opposing sides of the central body 452 and are perpendicular to the interposer spring member central body 452. As such the interposer spring member arms 454 are substantially parallel to and substantially aligned with the retention beams 434. In an illustrative embodiment, the interposer spring members 450 each have six interposer spring member arms 454, wherein three interposer spring member arms 454 extend from each opposing side of the central body 452. These six interposer spring member arms 454 are positioned directly beneath and are parallel with the three retention beams 434 of the heat sink clip 430. The central bodies 452 of each interposer spring member 450 engage the retention beams 434 and are retained in position when the heat sink clip 430 is installed over the receptacle assemblies 104. The interposer spring member arms 454 engage the heat sinks 150 at the contact points 456 when the heat sink clips 430 are installed. The heat sinks 150 have notched or cut out portions 172 to accommodate the interposer spring members 450. The interposer spring members 450 flex to permit the heat sinks 150 to move outward away from the guide frames 122 when the module assemblies 102 are installed. The interposer spring members 450 exert a desired force against the heat sinks 150 to maintain a desired abutting interface to facilitate thermal transfer and heat dissipation from the module assemblies 102. In an exemplary embodiment, the interposer spring members 450 exert at least one pound of force against the heat sinks 150.

Figure 9:
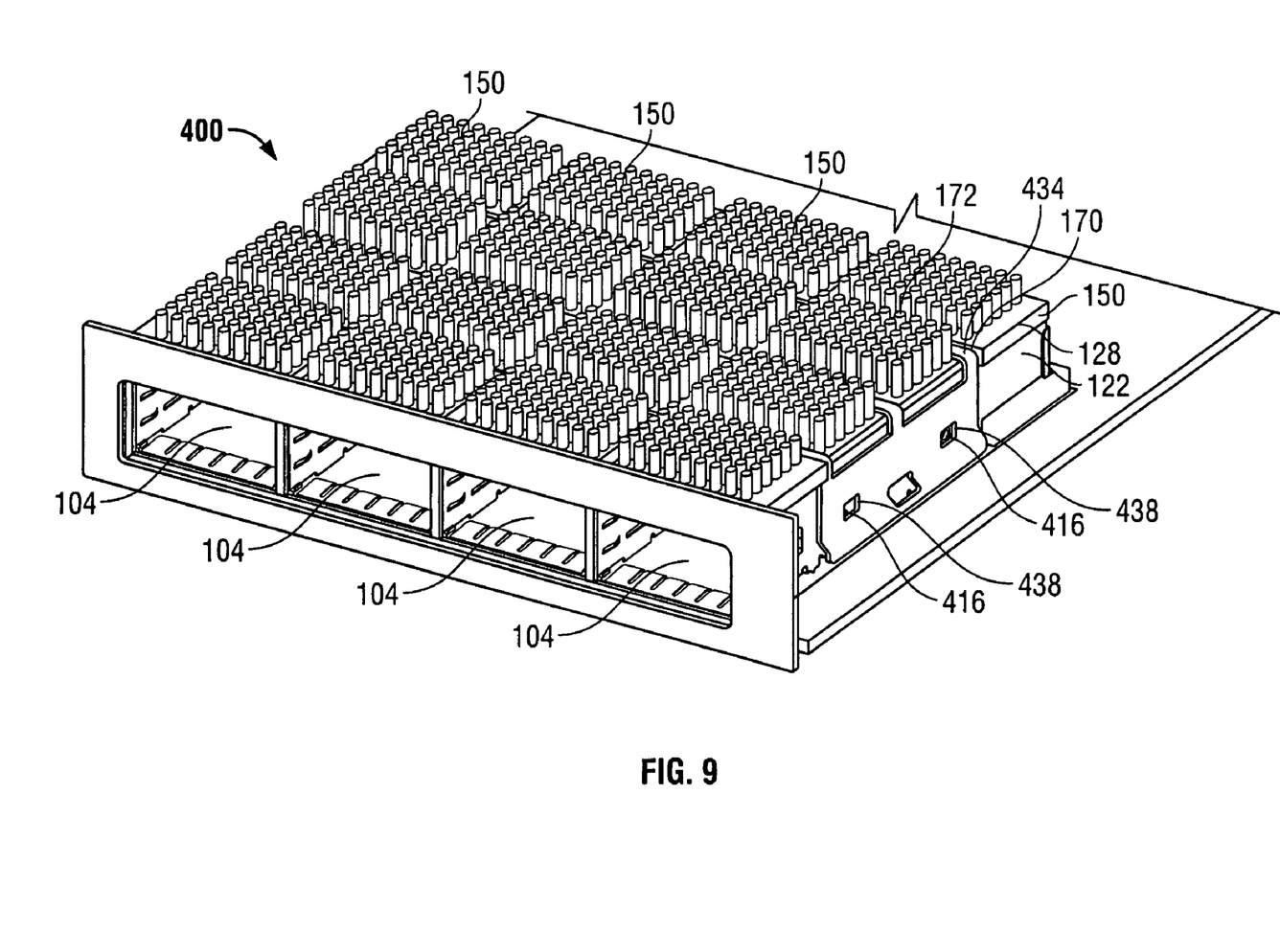
FIG. 9 is a an assembled perspective view of the heat sink assembly and the receptacle assembly shown in FIG. 6.

FIG. 9 illustrates an exemplary embodiment of the receptacle assembly 400 in an assembled state. The receptacle assembly 400 includes at least two receptacle assemblies 104. The heat sinks 150 are positioned on the top walls 128 of the guide frames 122, and are secured by the heat sink clip 430 which is positioned within the notched portion 170 of the outer most heat sinks 150. The retention beams 434 are positioned atop the interposer spring members 450 (not shown) within the cut out portions 172 of the heat sinks. The heat sink clip 430 is secured to the guide frames 122 via the retention features 416 which engage the engagement openings 438 in the heat sink clip 430.

As such, the receptacle assembly 400 provides a plurality of receptacle assemblies having heat sinks configured to physically contact transceiver modules when installed. The heat sinks dissipate heat generated in the modules and facilitate a data transmission rate of 10 Gbs through the assembly.

While the invention has been described in terms of various specific embodiments, those skilled in the art will recognize that the invention can be practiced with modification within the spirit and scope of the claims.

What is claimed is:

1. A receptacle assembly, comprising:
   a plurality of guide frames, each of said guide frames having top, bottom and side walls joined to form an interior cavity configured to receive an electrical module, each of said plurality of guide frames having a heat sink opening extending through one of said top, bottom and side walls;
   a heat sink mounted over each of said guide frames and extending through a respective one of said heat sink openings, each respective heat sink having an engagement surface located proximate said interior cavity of said respective guide frame, said engagement surface of each heat sink being configured to physically contact a respective module when installed in said respective interior cavity; and
   a single heat sink clip spanning said plurality of guide frames.

2. The receptacle assembly of claim 1 wherein said heat sink clip comprises retention beams extending over said plurality of guide frames, said assembly further comprising interposer spring elements actuated by said retention beams.

3. The receptacle assembly of claim 1, further comprising a plurality of spring elements secured over a respective one of said plurality of heat sinks, each said spring element contacting a respective heat sink and exerting a damping force thereupon.

4. The receptacle assembly of claim 1 wherein said clip comprises side rails that snap over said side walls of said plurality of guide frames, said side rails being joined by retention beams, each of said retention beams engaging a plurality of interposer spring members that extend over, and flexibly engage, said heat sinks of each respective guide frame.

5. The receptacle assembly of claim 1, wherein said engagement surface of each heat sink rests within a respective one of said interior cavities of said guide frames at a level that interferes with an installation path of the module, each said heat sink being movable outward by the module when the module is installed to provide an abutting interface between the heat sink and module.

6. The receptacle assembly of claim 1, wherein said engagement surface of each of said heat sinks is flat and smooth to slide along a mating surface of the module when installed.

7. The receptacle assembly of claim 1 wherein said plurality of guide frames comprises four guide frames.

8. A transceiver receptacle assembly, comprising:
a plurality of guide frames aligned with one another, each said guide frame having top, bottom and side walls joined to form an interior cavity configured to receive a transceiver, said top wall having a heat sink opening therethrough;
a plurality of heat sinks, each of said heat sink mounted over each respective heat sink opening of said guide frames, each said heat sink having an engagement surface located proximate said interior cavity of each respective guide frame, said engagement surface of said heat sink being configured to physically contact the transceiver when installed in said interior cavity;
a plurality of interposer spring elements, each of said interposer spring elements exerting a normal force on a respective one of said plurality of heat sinks; and
a single clip extending over said plurality of interposer spring elements.

9. The transceiver receptacle assembly of claim 8, said spring elements flexing to permit said heat sink to move outward away from said guide frame when the transceiver is inserted, said clip having side rails that snap over said side walls of said plurality of guide frames.

10. The receptacle assembly of claim 8 wherein said clip comprises retention beams spanning said plurality of interposer spring elements, each of said retention beams flexing said plurality of interposer spring elements to flexibly engage said heat sinks of each respective guide frame.

11. The receptacle assembly of claim 8, wherein said engagement surface of each of said heat sinks is flat and smooth to slide along a mating surface of the transceiver when installed.

12. The receptacle assembly of claim 8 wherein said plurality of guide frames comprises four guide frames.

13. An electronic transceiver assembly, comprising:
a plurality of guide frames, each of said guide frames having top, bottom and side walls joined to form an interior cavity and having a heat sink opening extending through one of said top, bottom and side walls;
a plurality of transceivers, each respective transceiver configured to be received in a respective one of said guide frames;
a plurality of heat sinks, each respective heat sink mounted over a respective one of said guide frames and extending through a respective one of said heat sink openings, each respective heat sink having an engagement surface located proximate said interior cavity of said respective guide frame, said engagement surface of each heat sink being configured to physically contact a respective one of said transceivers when installed in said respective interior cavity, and
a single heat sink clip spanning said plurality of guide frames.

14. The receptacle assembly of claim 13 wherein said heat sink clip comprises retention beams extending over said plurality of guide frames, said assembly further comprising interposer spring elements actuated by said retention beams.

15. The receptacle assembly of claim 13, further comprising a plurality of spring elements secured over a respective one of said plurality of heat sinks, said spring element contacting each of said respective heat sinks and exerting a clamping force thereupon.

16. The receptacle assembly of claim 13 wherein said clip comprises side rails that snap over said side walls of said plurality of guide frames, said side rails being joined by retention beams, each of said retention beams engaging a plurality of interposer spring members that extend over, and flexibly engage, said heat sinks of each respective guide frame.

17. The receptacle assembly of claim 13, wherein said engagement surface of each heat sink rests within a respective one of said interior cavities of said guide frames at a level that interferes with an installation path of the respective transceiver, each said heat sink being movable outward by the respective transceiver when the respective transceiver is installed to provide an abutting interface between the respective heat sink and the respective transceiver.

18. The receptacle assembly of claim 13, wherein said engagement surface of each of said heat sinks is flat and smooth to slide along a mating surface of the respective transceiver when installed.

19. The receptacle assembly of claim 13, wherein each of said transceiver modules is configured to transmit data signals at rates up to 10 Gbs.

20. The receptacle assembly of claim 13 wherein said plurality of guide frames comprises four guide frames.

* * * * *